United States Patent [19]

Kamikawa

[11] Patent Number: 5,443,540
[45] Date of Patent: Aug. 22, 1995

[54] APPARATUS AND METHOD FOR DRYING SUBSTRATES

[75] Inventor: Yuuji Kamikawa, Kumamoto, Japan

[73] Assignees: Tokyo Electron Limited, Tokyo; Tokyo Electron Kyushu Limited, Tosu, both of Japan

[21] Appl. No.: 171,643

[22] Filed: Dec. 22, 1993

[30] Foreign Application Priority Data

Dec. 25, 1992 [JP] Japan .................. 4-357985

[51] Int. Cl.⁶ .............................................. F26B 3/00
[52] U.S. Cl. ............................ 34/471; 34/75; 34/73; 34/78; 134/105
[58] Field of Search .......... 34/73, 74, 75, 78, 391, 34/428, 467, 468, 469, 471; 134/104, 105, 107

[56] References Cited

U.S. PATENT DOCUMENTS

| | | | |
|---|---|---|---|
| 4,348,174 | 9/1982 | Spigarelli | 34/78 |
| 4,558,524 | 12/1985 | Peck et al. | 34/78 |
| 4,679,721 | 7/1987 | Kondo | 134/105 |
| 4,777,970 | 10/1988 | Kusuhara | 34/78 |
| 4,841,645 | 6/1989 | Bettcher et al. | 34/78 |
| 5,054,210 | 10/1991 | Schumacher et al. | 34/73 |

FOREIGN PATENT DOCUMENTS 61-237429 10/1986 Japan .
61-237430 10/1986 Japan .
5-28491 4/1993 Japan .

*Primary Examiner*—Denise L. Gromada
*Attorney, Agent, or Firm*—Oblon, Spivak, McClelland, Maier & Neustadt

[57] ABSTRACT

An apparatus for drying substrates such as wafers while contacting IPA vapor with them to remove that solution, which adheres to them when they are washed, includes a vessel in which IPA is stored, a unit for supplying the IPA into the vessel, a unit for draining the IPA from the vessel, heater block arranged contactable with the underside of the vessel to heat the IPA in the vessel by heat conduction, a boat elevator for positioning the substrates in a steam existing space in which steam generated from the heated process solution and a water cooling system arranged in the vessel to exchanged heat between the IPA and cooling water so as to cool the IPA, which is to be drained from the vessel, by the cooling water.

10 Claims, 5 Drawing Sheets

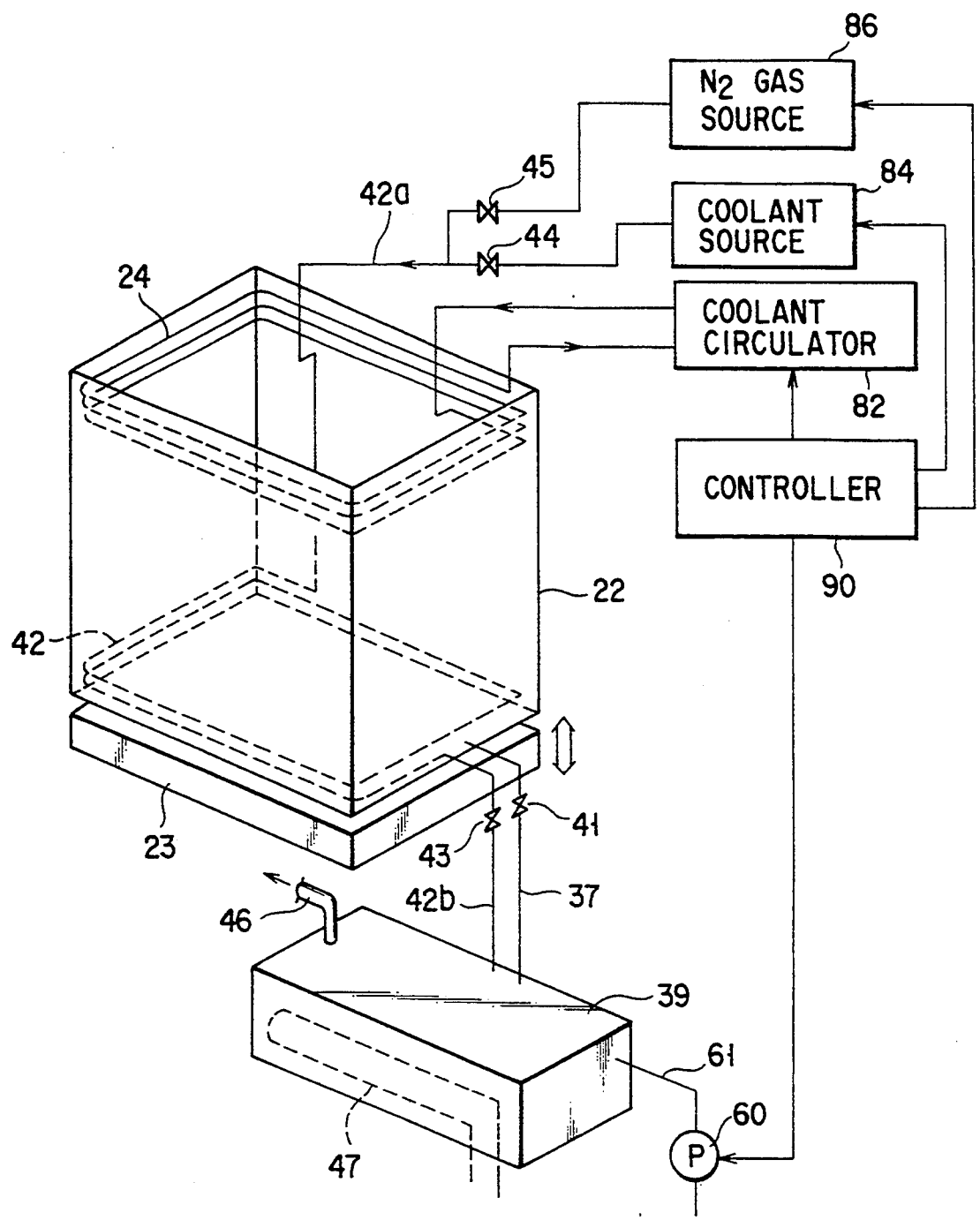
F I G. 3

APPARATUS AND METHOD FOR DRYING SUBSTRATES

BACKGROUND OF THE INVENTION

1. Field of the Invention

The present invention relates to an apparatus and a method for drying semiconductor wafers and LCD glass substrates, for example, after they are washed by washing solution.

2. Description of the Related Art

In the course of manufacturing semiconductor devices, the semiconductor wafers are washed while immersing them successively in chemical solutions in chemical solution vessels. That solution which adheres to them when they are washed is then removed from them by the substrates-drying apparatus in a drying chamber.

U.S. patent application Ser. No. 08/111,006 discloses a substrates-drying apparatus of this kind. In this substrates-drying apparatus, a volatile process solution such as IPA (isopropylalcohol) is stored in a process solution vessel and it is heated by a heater to generate IPA vapor in the vessel. When the wafers are set above this vapor generating region in the vessel, IPA vapor condenses on them and water which has adhered to them when they are washed is thus removed from them . They can be thus made dry.

In the substrates-drying apparatus of this kind, however, water mixes in IPA in the process solution vessel to thereby lower the substrates-drying capacity of IPA. Therefore, IPA must be replaced by new one when the substrates-drying process is repeated certain times (or every 10-batch).

IPA has a low boiling point (of 60°-80° C.) and it is likely to be inflamed. For safety, therefore, it must be drained from the process solution vessel after its temperature becomes lower than its boiling point.

In the conventional substrates-drying apparatus, however, the heater has a large heat capacity. This prevents IPA from being cooled lower than the boiling point for a shot time. In addition, it takes a long time to replace IPA in the vessel with new one. The substrates-drying capacity is thus made low together with the throughput.

SUMMARY OF THE INVENTION

The object of the present invention is therefore to provide a substrates-drying apparatus capable of cooling the heated process solution for a shorter time, shortening the solution-replacing time, and enhancing its throughput to a greater extent.

According to an aspect of the present invention, there can be provided a substrates-drying apparatus for removing water or water drops from substrates while contacting the vapor of a process solution with them comprising a vessel in which the process solution is stored; means for supplying the process solution into the vessel; means for draining the process solution from the vessel; a heater block arranged contactable with the bottom of the vessel to heat the process solution in the vessel by heat conduction; means for positioning the substrates in a steam existing space in which steam generated from the heated process solution; and means arranged in the vessel to exchange heat between the process solution and a coolant so as to cool the process solution, which is to be drained from the vessel by the draining means, by the coolant.

According to another aspect of the present invention, there can be provided a substrates-drying method comprising heating a process solution stored in a vessel to generate solution vapor in the vessel; carrying substrates into a vapor generating region in the vessel; removing that solution, which adheres to the substrates when they are washed, from them while applying the vapor of the process solution to them; and positively cooling the process solution when it is drained from the vessel.

According to a substrates-drying apparatus of the present invention, the process solution in the process solution vessel can be forcedly and more quickly cooled by the cooling means whatever heat capacity the heater block may have. The time needed to replace the process solution by new one can be thus shortened. This is because the cooling means is provided to cool the process solution when it is drained from the process solution vessel.

For the purpose of cooling the process solution more quickly, it is preferable that the heater block is released from the bottom of the process solution vessel by a lifter means when the process solution in the vessel is cooled.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a perspective view schematically showing a vessel, a heater and a cooling system;

DETAILED DESCRIPTION OF THE PREFERRED EMBODIMENTS

The substrates-drying apparatus according to an embodiment of the present invention will be described with reference to the accompanying drawings.

Figure 1:
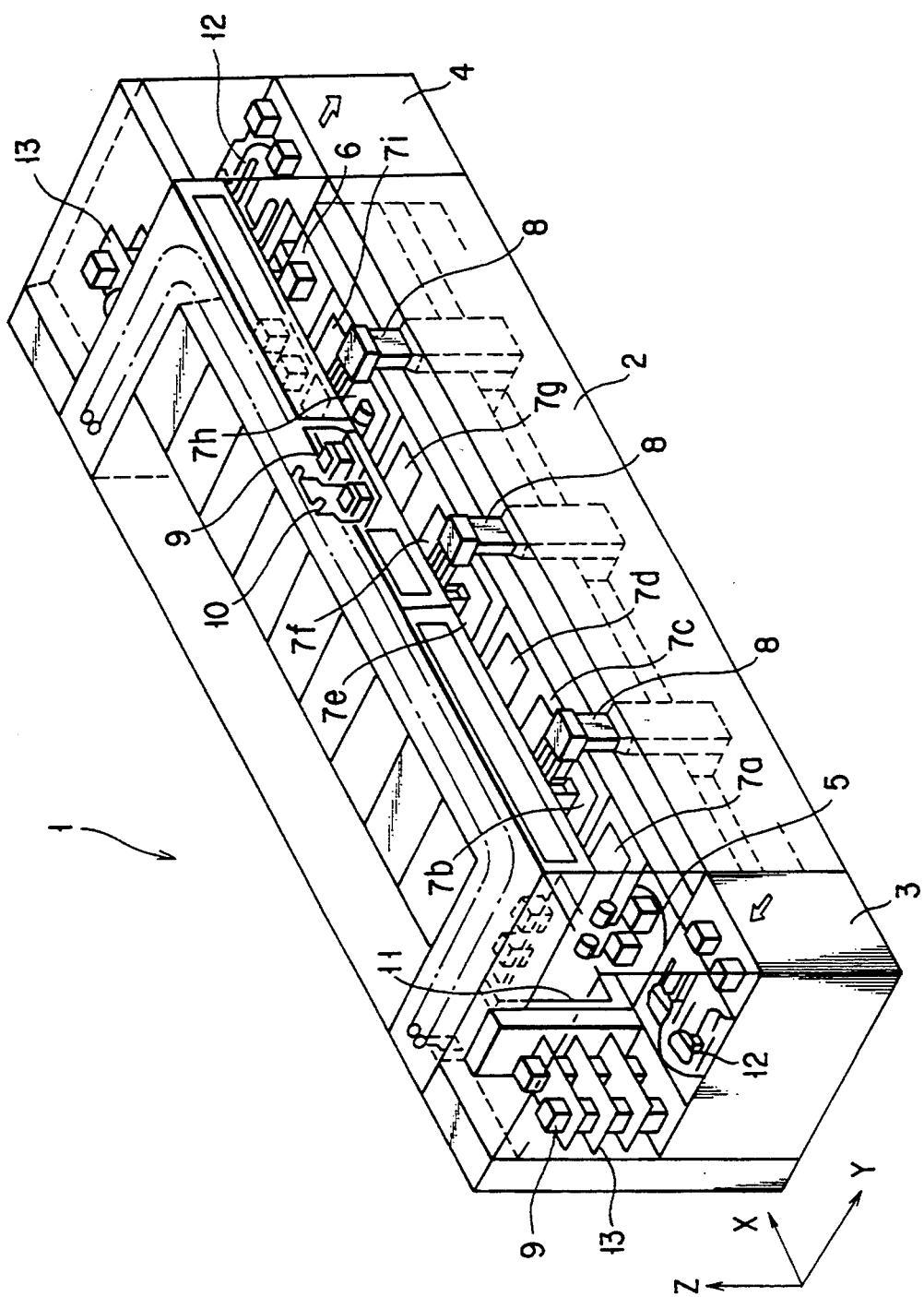
FIG. 1 is a perspective view schematically showing the whole of the washing system

A substrates-drying apparatus 7i according to the present invention is located in a process section 2 of the washing system 1 and adjacent to the terminal end thereof, as shown in FIG. 1, when viewed in connection with the flow of substrates-processing steps. A loader section 5 is arranged along one side of the process section 2 and it is connected to an input buffer unit 3. An unloader section 6 is arranged along the other side of the process section 2 and it is connected to an output buffer unit 4.

The process section 2 includes nine process units 7a–7i arranged side by side and each of them has a process solution vessel made of quartz or SiC. When viewed from the loader section side of the process section 2 to the unloader section side thereof, they are a unit 7a for washing and drying wafer chucks, a unit 7b for processing wafers with chemical solution, unit 7c for washing them with water, a unit 7d for washing them with water, a unit 7e for processing them with chemical solution, a unit 7f for washing them with water, a unit 7g for washing them with water, a unit 7h for washing and drying the wafer chucks, and a unit 7i for drying the wafers.

Wafer carrier units are arranged along one side of these process units 7a–7i. Each of them has wafer chucks movable along X and Z axes and 50 sheets of wafers are held together and carried to each of the process vessels by the wafer chucks. The present invention provides three wafer carrier units 8 and each of them is allowed to run in a limited area not to mix chemical solution in the chemical solution unit 7b with the one in the chemical solution unit 7e, for example. A carrier 10 runs along and above the loader section 5, the section of the carrier units 8 and the unloader section 6 to carry empty wafer cassettes 9 from the loader section 5 to the unloader section 6. An lifter 11 is also arranged in each of the loader and unloader sections 5 and 6 to carry the empty wafer cassettes 9 up and down in the section.

Figure 2:
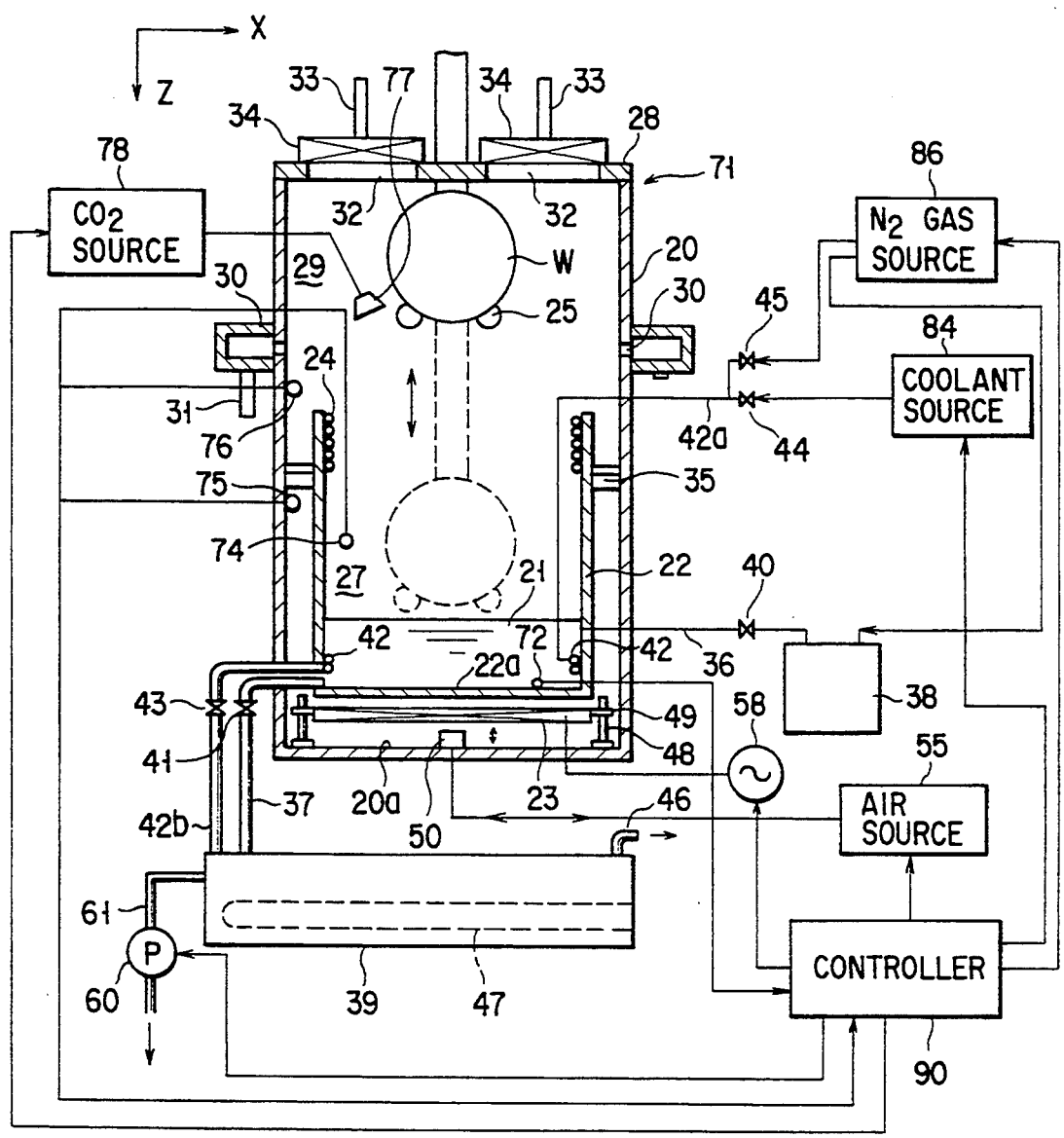
FIG. 2 is a vertically-sectioned view showing the main portion of substrates-drying apparatus according to an embodiment of the present invention.

As shown in FIG. 2, a chemical solution vessel 22 of the substrates-drying unit 7i is housed in a case 20 made of stainless steel. It is supported by support members 35 which are attached to inner faces of side walls of the case 20. It is made of erosion-resistant material such as quartz. A space is provided between the surface of chemical solution 21 in it and a coolant circulating pipe 24 and this space is used as a vapor generating region 27. A wafer boat 25 in which 50 sheets of wafers W have been seated side by side in a line can be therefore held in the space or region 27 in it. A shutter 28 is arranged, freely openable, on the top of the case 20. Another space is provided between the shutter 28 and the coolant circulating pipe 24 and it is used as a drying region 29. The wafer boat 25 having 50 sheets of wafers W therein can also be held in it in the case 20.

The lower portion of the chemical solution vessel 22 is communicated with an IPA tank 38 through a solution supply pipe 36. The IPA tank 38 is communicated with an $N_2$ gas supply source 86. when $N_2$ gas is forced into the tank 38, IPA 21 is supplied into the chemical solution vessel 22. A control valve in the $N_2$ gas supply source 86 is connected to the output side of a controller 90.

A heater block 23 is arranged under the chemical solution vessel 22 and when IPA 21 in the vessel 22 is heated by the heater block 23, the vapor generating region in the vessel 22 is filled with IPA vapor. A heater power source 58 is connected to the output side of the controller 90.

A flame detecting sensor 75, a temperature sensor 76 and a fire-extinguishing nozzle 77 are arranged in the case 20. The flame and temperature detecting sensors 75 and 76 are connected to the input side of the controller 90 while a $CO_2$ gas supply source 78 which supplies $CO_2$ gas to the fire-extinguishing nozzle 77 is connected to the output side of the controller 90. A fire preventing system is thus formed and a fire which may be made when IPA is over-heated can be prevented by this system. Another temperature sensor 72 is arranged on the bottom of the chemical solution vessel 22. It is connected to the input side of the controller 90 to detect the temperature of IPA solution in the vessel 22 and to prevent IPA solution from being overheated. A level sensor 74 is arranged in the vapor generating region 27 in the chemical solution vessel 22.

The heater block 23 is supported on the bottom of the case 20 by guide rods 48 and guides 49. It is moved up and down by an air cylinder 50 and an air supply source 55 for the cylinder 50 is connected to the output side of the controller 90.

The coolant circulating pipe 24 runs along the inner face of the upper wall portion of the chemical solution vessel 22, as shown in FIG. 3. It is communicated with the inlet and outlet of a coolant circulator 82. When the upper portion of the chemical solution vessel 22 is cooled by water or coolant which circulates through the pipe 24, IPA vapor condenses there, as water drops, to return to the bottom of the vessel 22.

Both sides of the case 20 which are below the drying region 29 have exhaust slits 30 which are communicated with exhaust pipes 31.

The shutter 28 has gas supply openings 32 which are communicated with gas supply pipes 33 through dust filters 34. $N_2$ gas supplied through the gas supply pipes 33 is made clean by the dust filters 34 and then supplied to the drying region 29 in the case 20 via the gas supply openings 32.

As shown in FIGS. 2 and 3, the chemical solution vessel 22 is communicated with the supply pipe 36 and it is also communicated with a tank 39 through a drain pipe 37. IPA 21 in the vessel 22 is thus made new when it is supplied through the pipe 36 and drained through the pipe 37. A cooling pipe 42 runs along the inner face of the lower portion of the vessel 22 and IPA 21 in the vessel 22 is cooled by coolant which circulates through the cooling pipe 42. For this purpose, one end of the cooling pipe 42 is communicated with a coolant supply source 84 through a supply pipe 42a while the other end thereof with the tank 39 through a drain pipe 42b. A switch valve 43 is attached to the drain pipe 42b. A control valve in the coolant supply source 84 is connected to the output side of the controller 90.

The supply pipe 42a is divided into two and cooling water or coolant is supplied to one of them through a switch valve 44 while $N_2$ gas to the other of them through a switch valve 45. A drain pipe 61 is connected to the drain tank 39 through a drain pump 60. An exhaust pipe 46 is also connected to the drain tank 39 and an emergency cooling pipe 47 is provided in it.

Figure 4:
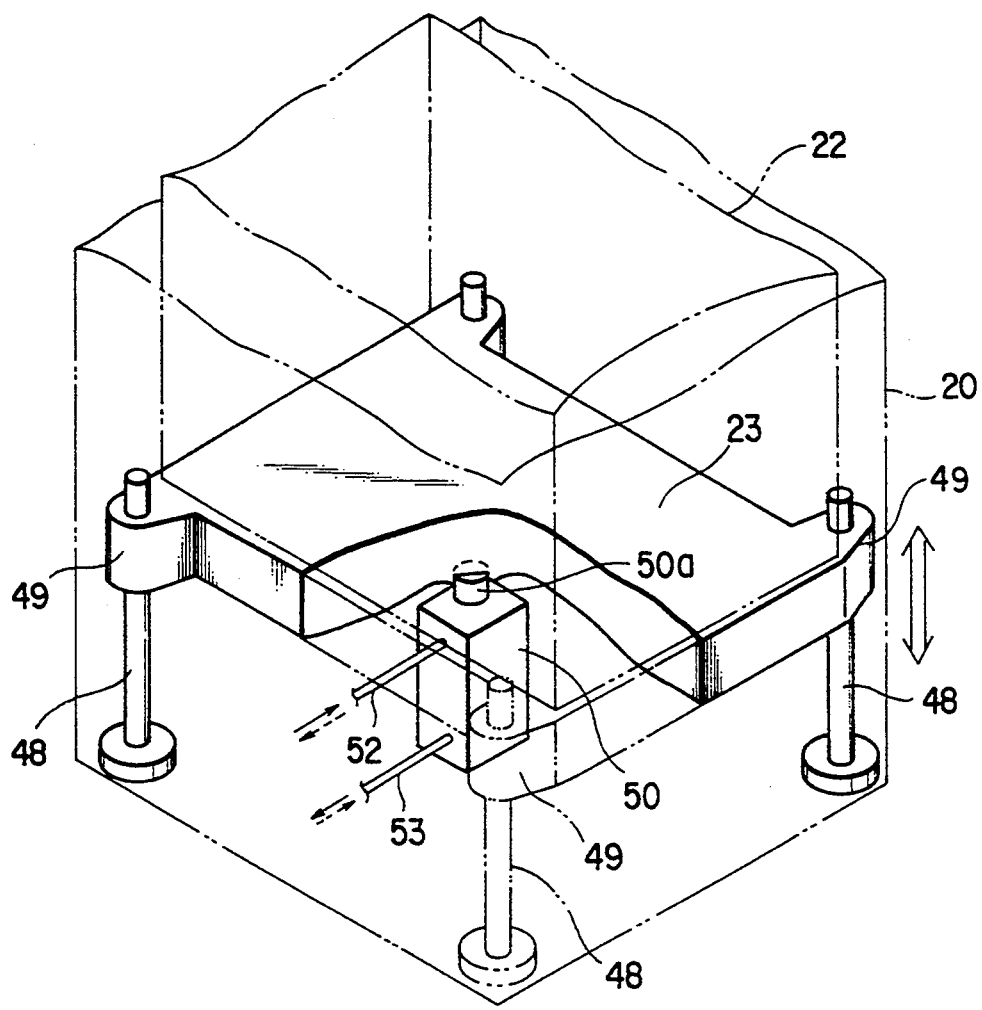
FIG. 4 is a perspective view schematically showing a lifter unit for the heater.

As shown in FIG. 4, the heater block 23 has the guides 49 at its four coroners, and the guide rods 48 pass through these guides 49 to guide the heater block 23 up and down. A piston rod 50a of the air cylinder 50 is connected to the underside of the heater block 23 at the center thereof. Air supply and exhaust pipes 52 and 53 are connected to the air cylinder 50 and they are communicated with the air supply source 55 which is controlled by the controller 90. when the piston rod 50a retreats into the cylinder 50, the heater block 23 is released from the bottom 22a of the chemical solution vessel 22 and when it comes out of the cylinder 50, the heater block 23 is closely contacted with the bottom 22a of the vessel 22. The stroke of the heater block 23 moved up and down is 5 to 15 mm in this case.

Figure 5:
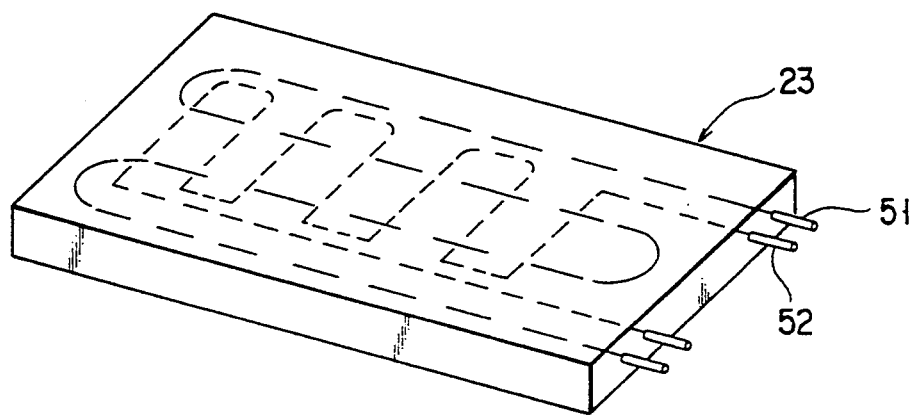
FIG. 5 is a perspective view showing the heater.

The heater block 23 is made of aluminium. A sheath or cartridge heater 51 is cast in it and an emergency cooling pipe 52 is embedded zigzag in it, crossing the sheath heater 51, as shown in FIG. 5. It is 50±5 mm thick×460 to 500 mm long×300 to 350 mm wide. The heat value of the sheath heater 51 6 to 10 K watts.

Figure 6:
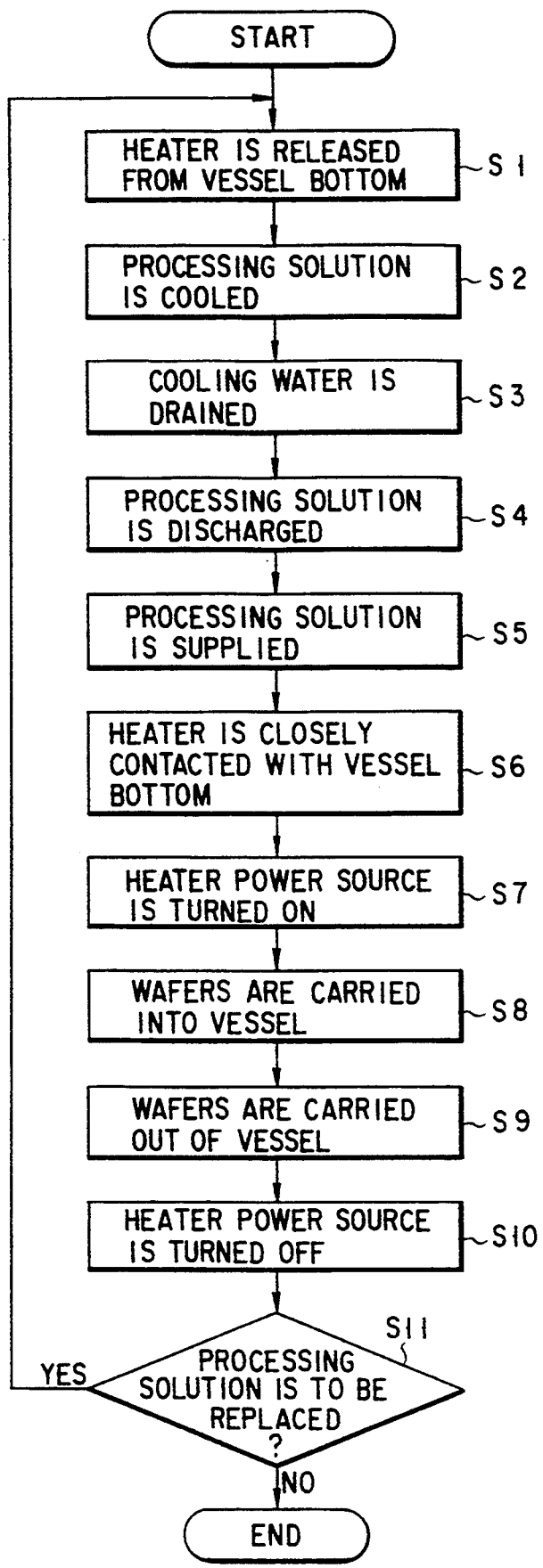
FIG. 6 is a chart intended to explain a substrates-drying method employed by the substrates-drying apparatus.

Referring to FIG. 6, it will be described how a plurality of wafers W are dried by the above-described substrates-drying apparatus.

IPA 21 is made new as follows. The drain and exhaust pipes 37 and 42b are connected to the drain tank 39 and the heater block 3 is released from the bottom 22a of the chemical solution vessel 22 (Step 1). The switch valves 43 and 44 are opened to supply coolant into the cooling pipe 42 through the supply pipe 42a. Heat is thus exchanged between the coolant in the pipe 42 and the IPA 21 in the vessel 22 to forcedly cool the IPA 21 (Step 2). The coolant used to cool the IPA 21 is collected into the drain tank 39.

When the temperature of the IPA 21 is thus made lower than its boiling point, the switch valve 44 is closed and the switch valve 45 is opened to supply $N_2$ gas into the cooling pipe 42 through the supply pipe 42. The coolant is thus pushed out of the cooling pipe 42 and the cooling pipe 42 is made empty (Step 3). The switch valves 43 and 45 are then closed. The switch valve 41 of the drain pipe 37 is opened to drain the IPA 21 from the vessel 22 into the drain tank 39 (Step 4). The IPA 21 is further discharged outside, as waste solution, from the tank 39 through the drain pipe 61 by the pump 60. The drain pipe 61 may be communicated with the IPA supply tank 38 via a reproducing unit (not shown). Water is removed from the waste IPA by the reproducing unit and IPA thus made clean is then returned into the vessel 22 in this case. The temperature of this clean IPA thus returned into the vessel 22 is substantially same as room temperatures.

When the draining of the IPA 21 is finished, the switch valve 41 of the drain pipe 37 is closed and the switch valve 40 of the chemical solution supply pipe 36 is opened to supply new IPA 21 from the tank 38 into the vessel 22. In short, this new IPA 21 is introduced into the vessel 22 while detecting the level of it in the vessel 22 by the level sensor 74 (Step 5). The amount of new IPA 21 introduced is about 4 liters.

When the introducing of new IPA 21 into the vessel 22 is finished, the switch valve 40 is closed and the heater block 23 is moved up to closely contact with the bottom 22a of the vessel 22 (Step 6). The heater power source 58 is turned on and the IPA 21 is heated by the heater block 23 (Step 7). The temperature of the heater block 23 is controlled to be about 220° C. during this heating step. The IPA 21 begins to boil at a temperature of about 80° C. If any abnormal overheating of the IPA should be detected by the temperature sensors 72 and 76, the heater power source 58 is turned off at once and coolant is supplied into the cooling pipe 42. If any flame should be detected by the flame detecting sensor 75, the heater power source 58 is turned off at once and $CO_2$ gas is jetted into the vapor generating region 27 in the vessel 22 through the nozzle 77.

When about 5 minutes lapse after the start of IPA heating, the vessel 22 is filled with IPA vapor. The boat 25 is lowered to set the wafers W in the vessel 22 (Step 8). The wafers W on the boat 25 have been washed and washing solution is now adhering to them. When they are kept in the region 27 for a predetermined time, IPA vapor acts on their surfaces to remove the washing solution from them. They can be thus made dry.

The boat 25 is lifted to carry the wafers w out of the vessel 22 (Step 9). The heater power source 58 is then turned off (Step 10). When a next group of wafers W is to be dried, it is not necessarily needed that the heater power source 58 is turned off, but the heater block 23 may be released from the bottom 22a of the vessel 22.

It is checked from the number of the drying process repeated whether or not the process solution 21 must be made new (Step 11). The value of IPA purity then gained may be used for this check. When it is determined that the process solution 21 must be made new, the process returns to the step 1. The heater block 23 is thus released from the bottom 22a of the vessel 22 and the steps 2 to 10 are then conducted. When it is determined that the solution 21 may not be made new, the process is finished or it returns to the step 7. The heater power source 58 is thus turned on again and the vessel 22 is filled with IPA vapor to dry a next group of wafers W. The average time needed to finish one cycle of steps 1 to 11 is about 20 minutes.

According to the above-described embodiment of the present invention, the IPA 21 in the chemical solution vessel 22 can be more quickly cooled whatever large heat capacity the heater block 23 may have. In addition, it can also be more quickly cooled because the heater block 23 is released from the bottom 22a of the vessel 22 by the lifter unit 50. The time needed to replace the IPA 21 with new one can be thus shortened up to 15 minutes. It took 2 hours in the conventional cases. Therefore, the present invention can save 1 hour 45 minutes.

Although IPA has been used in the above-described embodiment, other chemical solutions such as hot sulfuric acid.

Although the heater block 23 has been released from the bottom 22a of the chemical solution vessel 22 in the above-described case because it has a large heat capacity, it may not be released from the vessel bottom 22a if an SiC heater, for example, having a small heat capacity is used for the heater block 23.

Merits which can be attained by the present invention are as follows.

Thanks to the solution cooling means arranged in the chemical solution vessel, the chemical solution can be more quickly cooled whatever heat capacity the heating means may have. The time needed to make the chemical solution new can be thus made shorter and the throughput can be enhanced accordingly.

Further, the chemical solution can be cooled even if the heating of the solution is stopped for a while every time the process is repeated. This prevents unnecessary vapor from being generated.

Furthermore, the heating means can be released from the bottom 22a of the chemical solution vessel by the lifter means when the chemical solution is to be cooled. This enables the chemical solution to be more quickly cooled.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A substrate-drying apparatus for removing water from at least one substrate while contacting the vapor of a process solution with said substrate, comprising:
   a vessel in which the process solution is stored;
   means for supplying the process solution into the vessel;
   means for draining the process solution from the vessel;
   a heater block arranged contactable with the bottom of the vessel to heat the process solution in the vessel by heat conduction;
   means for positioning the substrate in a steam existing space in which steam is generated from the heated process solution; and
   cooling means dipped in the process solution within the vessel to achieve heat exchange between the process solution and a coolant for cooling the process solution, which is to be drained from the vessel by the draining means, by the coolant.

2. The substrate-drying apparatus according to claim 1, further comprising lifter means arranged under the vessel to move the heater block up and down wherein the heater block is released from the bottom of the vessel by the lifter means when the process solution is to be draining from the vessel by the draining means.

3. The substrate-drying apparatus according to claim 2, wherein said lifter means includes guides formed at four corners of the heater block, guide rods freely slidably inserted into the guides, and a cylinder having a piston rod connected to the under-side of the heater block.

4. The substrate-drying apparatus according to claim 1, wherein said heater block is made of metal and includes a sheath heater embedded therein.

5. The substrate-drying apparatus according to claim 1, further comprising a case enclosing the vessel, a shutter arranged on the top of the case, and a boat for supporting the substrates thereon to carry them into the vessel when the shutter is opened.

6. A substrate-drying apparatus for removing a solution attached to a substrate from the substrate by applying a vapor of a process solution to the substrate, comprising:
   a vessel in which the process solution is stored;
   means for supplying the process solution into said vessel;
   means for draining the process solution stored in the vessel;
   a heater block mounted to be capable of contact with an outer bottom surface of the vessel for heating the process solution within the vessel by heat conduction;
   means for positioning the substrate in a region of vapor generated from the heated process solution;
   cooling means adapted to achieve heat exchange between the process solution and a coolant for cooling said process solution, which is to be drained by said draining means, by the coolant; and
   moving means mounted below the vessel for moving the heater block;
   wherein the heater block is released from the outer bottom surface of the vessel when the process solution is drained from the vessel by the draining means.

7. The substrate-drying apparatus according to claim 6, wherein said cooling means is a system in which water is used as the coolant, and the water cooling system has a heat transmitting pipe immersed in the process solution in the vessel.

8. The substrate-drying apparatus according to claim 7, further comprising means for forcedly draining the coolant from the heat transmitting pipe of the water cooling system.

9. The substrate-drying apparatus according to claim 8, further comprising a drain tank for storing the process solution drained, and also storing the coolant forcedly drained from the heat transmitting pipe.

10. A substrate-drying method comprising:
    heating a process solution stored in a vessel to evaporate the process solution within the vessel;
    arranging at least one substrate in a vapor-generating region within the vessel;
    applying the vapor of the process solution to the substrate to remove from the substrate other solutions attached to the substrate;
    draining process solution from the vessel; and
    releasing a heater block from the bottom of the vessel when the process solution is drained from the vessel.

* * * * *